US008897457B2

(12) United States Patent

Goldstein et al.

(10) Patent No.: US 8,897,457 B2

(45) Date of Patent: *Nov. 25, 2014

(54) METHOD AND DEVICE FOR ACOUSTIC MANAGEMENT CONTROL OF MULTIPLE MICROPHONES

(71) Applicant: Personics Holdings Inc., Boca Raton, FL (US)

(72) Inventors: Steven Wayne Goldstein, Delray Beach, FL (US); Marc Andre Boillot, Plantation, FL (US); Jason McIntosh, Sugar Hill, GA (US); John Usher, Devon (GB)

(73) Assignee: Personics Holdings, LLC., Boca Raton, FL (US)

(*) Notice: Subject to any disclaimer, the term of this patent is extended or adjusted under 35 U.S.C. 154(b) by 0 days.

This patent is subject to a terminal disclaimer.

(21) Appl. No.: 13/654,771

(22) Filed: Oct. 18, 2012

(65) Prior Publication Data

US 2013/0039518 A1 Feb. 14, 2013

Related U.S. Application Data

(63) Continuation of application No. 12/135,816, filed on Jun. 9, 2008, now Pat. No. 8,315,400, which is a continuation of application No. 12/115,349, filed on May 5, 2008, now Pat. No. 8,081,780.

(60) Provisional application No. 60/916,271, filed on May 4, 2007.

(51) Int. Cl.
*H03G 3/20* (2006.01)
*H04R 3/00* (2006.01)

(52) U.S. Cl.
CPC .................................... *H04R 3/005* (2013.01)
USPC .............. 381/57; 381/56; 381/110; 381/94.2; 381/94.3; 381/328

(58) Field of Classification Search
USPC .................... 381/56–57, 74, 66, 83, 93, 110, 381/94.2–94.3, 328
See application file for complete search history.

(56) References Cited

U.S. PATENT DOCUMENTS

| | | | |
|---|---|---|---|
| 5,131,032 | A | 7/1992 | Esaki |
| 5,692,059 | A | 11/1997 | Kruger |

(Continued)

OTHER PUBLICATIONS

Office Action for U.S. Appl. No. 12/245,316, filed Oct. 3, 2008, mailed Jun. 20, 2012.

(Continued)

*Primary Examiner* — Disler Paul
(74) *Attorney, Agent, or Firm* — Pablo Meles

(57) ABSTRACT

An earpiece (100) and a method (640) for acoustic management of multiple microphones is provided. The method can include capturing an ambient acoustic signal from an Ambient Sound Microphone (ASM) to produce an electronic ambient signal, capturing in an ear canal an internal sound from an Ear Canal Microphone (ECM) to produce an electronic internal signal, measuring a background noise signal, and mixing the electronic ambient signal with the electronic internal signal in a ratio dependent on the background noise signal to produce a mixed signal. The mixing can adjust an internal gain of the electronic internal signal and an external gain of the electronic ambient signal based on the background noise characteristics. The mixing can account for an acoustic attenuation level and an audio content level of the earpiece.

31 Claims, 8 Drawing Sheets

(56) References Cited

U.S. PATENT DOCUMENTS

| | | | | |
|---|---|---|---|---|
| 5,796,819 | A | 8/1998 | Romesburg | |
| 5,963,901 | A | 10/1999 | Vahatalo | |
| 6,021,207 | A | 2/2000 | Puthuff | |
| 6,081,732 | A | 6/2000 | Suvanen | |
| 6,118,878 | A | 9/2000 | Jones | |
| 6,169,912 | B1 | 1/2001 | Zuckerman | |
| 6,466,666 | B1 | 10/2002 | Eriksson | |
| 6,570,985 | B1 | 5/2003 | Romesburg | |
| 6,631,196 | B1 | 10/2003 | Taenzer | |
| 6,728,385 | B2 | 4/2004 | Kvaloy | |
| 6,738,482 | B1 | 5/2004 | Jaber | |
| 6,760,453 | B1 | 7/2004 | Banno | |
| 7,003,097 | B2 | 2/2006 | Marchok | |
| 7,349,353 | B2 | 3/2008 | Guduru | |
| 7,403,608 | B2 | 7/2008 | Auvray | |
| 7,783,054 | B2 * | 8/2010 | Ringlstetter et al. | 381/59 |
| 7,817,803 | B2 | 10/2010 | Goldstein | |
| 7,986,802 | B2 * | 7/2011 | Ziller | 381/334 |
| 8,027,481 | B2 | 9/2011 | Beard | |
| 2001/0046304 | A1 * | 11/2001 | Rast | 381/74 |
| 2004/0202340 | A1 | 10/2004 | Armstrong | |
| 2005/0058313 | A1 * | 3/2005 | Victorian et al. | 381/315 |
| 2005/0069161 | A1 | 3/2005 | Kaltenbach | |
| 2006/0067512 | A1 | 3/2006 | Boillot | |
| 2007/0036342 | A1 | 2/2007 | Boillot | |
| 2007/0189544 | A1 | 8/2007 | Rosenberg | |
| 2008/0019539 | A1 * | 1/2008 | Patel et al. | 381/96 |
| 2009/0034748 | A1 | 2/2009 | Sibbald | |

OTHER PUBLICATIONS

Office Action for U.S. Appl. No. 12/245,316, mailed Oct. 28, 2011.
Office Action for U.S. Appl. No. 12/170,171, mailed Sep. 14, 2011.
Office Action for U.S. Appl. No. 12/170,171, mailed Mar. 22, 2012.
Office Action for U.S. Appl. No. 12/135,816, mailed Oct. 20, 2011.

* cited by examiner

900

METHOD AND DEVICE FOR ACOUSTIC MANAGEMENT CONTROL OF MULTIPLE MICROPHONES

CROSS REFERENCE TO RELATED APPLICATIONS

This Application is a Continuation of U.S. application Ser. No. 12/135,816, filed Jun. 9, 2008 which is Continuation of U.S. application Ser. No. 12/115,349 filed May 5, 2008, which claims the priority benefit of Provisional Application No. 60/916,271 filed on May 4, 2007, the entire disclosures of which are incorporated herein by reference.

FIELD

The present invention pertains to sound reproduction, sound recording, audio communications and hearing protection using earphone devices designed to provide variable acoustical isolation from ambient sounds while being able to audition both environmental and desired audio stimuli. Particularly, the present invention describes a method and device for controlling a voice communication system by monitoring the user's voice with an ambient sound microphone and an ear canal microphone.

BACKGROUND

People use portable communication devices primarily for voice communications and music listening enjoyment. A mobile device or headset generally includes a microphone and a speaker. In noisy conditions, background noises can degrade the quality of the listening experience. Noise suppressors attempt to attenuate the contribution of background noise in order to enhance the listening experience.

In an earpiece, multiple microphones can be used to provide additional noise suppression. A need however exists for acoustic management control of the multiple microphones.

SUMMARY

Embodiments in accordance with the present invention provide a method and device for acoustic management control of multiple microphones.

In a first embodiment, a method for acoustic management control suitable for use in an earpiece can include the steps of capturing an ambient acoustic signal from at least one Ambient Sound Microphone (ASM) to produce an electronic ambient signal, capturing in an ear canal an internal sound from at least one Ear Canal Microphone (ECM) to produce an electronic internal signal, measuring a background noise signal from the electronic ambient signal or the electronic internal signal, and mixing the electronic ambient signal with the electronic internal signal in a ratio dependent on the background noise signal to produce a mixed signal.

The method can include increasing an internal gain of the electronic internal signal while decreasing an external gain of the electronic ambient signal when the background noise levels increase. The method can similarly include decreasing an internal gain of the electronic internal signal while increasing an external gain of the electronic ambient signal when the background noise levels decrease. Frequency weighted selective mixing can also be performed when mixing the signals. The mixing can include filtering the electronic ambient signal and the electronic internal signal based on a characteristic of the background noise signal, such as a level of the background noise level, a spectral profile, or an envelope fluctuation.

In a second embodiment, a method for acoustic management control suitable for use in an earpiece can include the steps of capturing an ambient acoustic signal from at least one Ambient Sound Microphone (ASM) to produce an electronic ambient signal, capturing in an ear canal an internal sound from at least one Ear Canal Microphone (ECM) to produce an electronic internal signal, detecting a spoken voice signal generated by a wearer of the earpiece from the electronic ambient signal or the electronic internal signal, measuring a background noise level from the electronic ambient signal or the electronic internal signal when the spoken voice signal is not detected, and mixing the electronic ambient signal with the electronic internal signal as a function of the background noise level to produce a mixed signal.

In a third embodiment, an earpiece for acoustic management control can include an Ambient Sound Microphone (ASM) configured to capture ambient sound and produce an electronic ambient signal, an Ear Canal Receiver (ECR) to deliver audio content to an ear canal to produce an acoustic audio content, an Ear Canal Microphone (ECM) configured to capture internal sound in an ear canal and produce an electronic internal signal, and a processor operatively coupled to the ASM, the ECM and the ECR. The processor can be configured to measure a background noise signal from the electronic ambient signal or the electronic internal signal, and mix the electronic ambient signal with the electronic internal signal in a ratio dependent on the background noise signal to produce a mixed signal.

The processor can filter the electronic ambient signal and the electronic internal signal based on a characteristic of the background noise signal using filter coefficients stored in memory or filter coefficients generated algorithmically. An echo suppressor operatively coupled to the processor can suppress in the mixed signal an echo of spoken voice generated by a wearer of the earpiece when speaking. The processor can also generate a voice activity level for the spoken voice and applies gains to the electronic ambient signal and the electronic internal signal as a function of the background noise level and the voice activity level.

DETAILED DESCRIPTION

Figure 1:
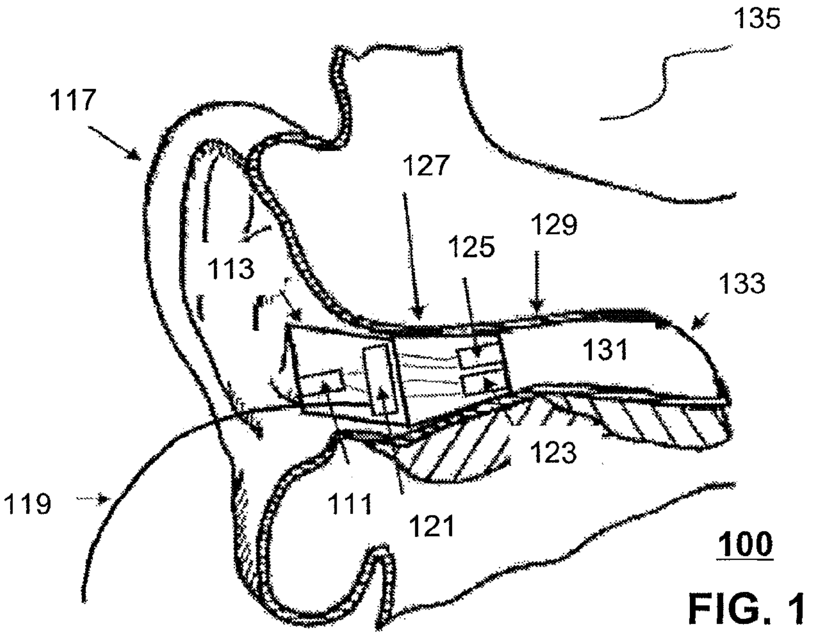
FIG. 1 is a pictorial diagram of an earpiece in accordance with an exemplary embodiment.

The following description of at least one exemplary embodiment is merely illustrative in nature and is in no way intended to limit the invention, its application, or uses.

Processes, techniques, apparatus, and materials as known by one of ordinary skill in the relevant art may not be discussed in detail but are intended to be part of the enabling description where appropriate, for example the fabrication and use of transducers.

In all of the examples illustrated and discussed herein, any specific values, for example the sound pressure level change, should be interpreted to be illustrative only and non-limiting. Thus, other examples of the exemplary embodiments could have different values.

Note that similar reference numerals and letters refer to similar items in the following figures, and thus once an item is defined in one figure, it may not be discussed for following figures.

Note that herein when referring to correcting or preventing an error or damage (e.g., hearing damage), a reduction of the damage or error and/or a correction of the damage or error are intended.

Various embodiments herein provide a method and device for automatically mixing audio signals produced by a pair of microphone signals that monitor a first ambient sound field and a second ear canal sound field, to create a third new mixed signal. An Ambient Sound Microphone (ASM) and an Ear Canal Microphone (ECM) can be housed in an earpiece that forms a seal in the ear of a user. The third mixed signal can be auditioned by the user with an Ear Canal Receiver (ECR) mounted in the earpiece, which creates a sound pressure in the occluded ear canal of the user. Alternatively, or additionally, the third mixed signal can be transmitted to a remote voice communications system, such as a mobile phone, personal media player, recording device, walkie-talkie radio, etc. Before the ASM and ECM signals are mixed, they can be subjected to different filters and at optional additional gains.

The characteristic responses of the ASM and ECM filter can differ based on characteristics of the background noise. In some exemplary embodiments, the filter response can depend on the measured Background Noise Level (BNL). A gain of a filtered ASM and a filtered ECM signal can also depend on the BNL. The BNL can be calculated using either or both the conditioned ASM and/or ECM signal(s). The BNL can be a slow time weighted average of the level of the ASM and/or ECM signals, and can be weighted using a frequency-weighting system, e.g. to give an A-weighted SPL level (i.e. the high and low frequencies are attenuated before the level of the microphone signals are calculated).

For example, at low BNLs (e.g. <60 dBA), the ECM signal can be attenuated relative to the ASM signal. At medium BNL, a mixture of the ASM and ECM signals can be performed. Moreover the ASM filter can attenuate low frequencies of the ASM signal, and the ECM filter can attenuate high frequencies of the ECM signal. At high BNL (e.g. >85 dB), the ASM filter can attenuate low frequencies of the ASM signal, and the ECM filter can attenuate high frequencies of the ECM signal. In another embodiment, the ASM and ECM filters can be adjusted by the spectral profile of the background noise measurement. For instance, if there is a large Low Frequency noise in the ambient sound field of the user, then the ASM filter can attenuate the low-frequencies of the ASM signal, and boost the low-frequencies of the ECM signal using the ECM filter.

At least one exemplary embodiment of the invention is directed to an earpiece for voice operated control. Reference is made to FIG. 1 in which an earpiece device, generally indicated as earpiece 100, is constructed and operates in accordance with at least one exemplary embodiment of the invention. As illustrated, earpiece 100 depicts an electro-acoustical assembly 113 for an in-the-ear acoustic assembly, as it would typically be placed in the ear canal 131 of a user 135. The earpiece 100 can be an in the ear earpiece, behind the ear earpiece, receiver in the ear, open-fit device, or any other suitable earpiece type. The earpiece 100 can be partially or fully occluded in the ear canal, and is suitable for use with users having healthy or abnormal auditory functioning.

Earpiece 100 includes an Ambient Sound Microphone (ASM) 111 to capture ambient sound, an Ear Canal Receiver (ECR) 125 to deliver audio to an ear canal 131, and an Ear Canal Microphone (ECM) 123 to assess a sound exposure level within the ear canal. The earpiece 100 can partially or fully occlude the ear canal 131 to provide various degrees of acoustic isolation. The assembly is designed to be inserted into the user's ear canal 131, and to form an acoustic seal with the walls 129 of the ear canal at a location 127 between the entrance 117 to the ear canal and the tympanic membrane (or ear drum) 133. Such a seal is typically achieved by means of a soft and compliant housing of assembly 113. Such a seal creates a closed cavity 131 of approximately 5 cc between the in-ear assembly 113 and the tympanic membrane 133. As a result of this seal, the ECR (speaker) 125 is able to generate a full range bass response when reproducing sounds for the user. This seal also serves to significantly reduce the sound pressure level at the user's eardrum 133 resulting from the sound field at the entrance to the ear canal 131. This seal is also a basis for a sound isolating performance of the electro-acoustic assembly 113.

Located adjacent to the ECR 125, is the ECM 123, which is acoustically coupled to the (closed or partially closed) ear canal cavity 131. One of its functions is that of measuring the sound pressure level in the ear canal cavity 131 as a part of testing the hearing acuity of the user as well as confirming the integrity of the acoustic seal and the working condition of the earpiece 100. In one arrangement, the ASM 111 can be housed in the in-the-ear assembly 113 to monitor sound pressure at the entrance to the occluded or partially occluded ear canal. All transducers shown can receive or transmit audio signals to a processor 121 that undertakes audio signal processing and provides a transceiver for audio via the wired or wireless communication path 119.

The earpiece 100 can actively monitor a sound pressure level both inside and outside an ear canal and enhance spatial and timbral sound quality while maintaining supervision to ensure safe sound reproduction levels. The earpiece 100 in various embodiments can conduct listening tests, filter sounds in the environment, monitor warning sounds in the environment, present notification based on identified warning sounds, maintain constant audio content to ambient sound levels, and filter sound in accordance with a Personalized Hearing Level (PHL).

The earpiece 100 can generate an Ear Canal Transfer Function (ECTF) to model the ear canal 131 using ECR 125 and ECM 123, as well as an Outer Ear Canal Transfer function (OETF) using ASM 111. For instance, the ECR 125 can deliver an impulse within the ear canal and generate the ECTF via cross correlation of the impulse with the impulse response of the ear canal. The earpiece 100 can also determine a sealing profile with the user's ear to compensate for any leakage. It also includes a Sound Pressure Level Dosimeter to estimate sound exposure and recovery times. This permits the earpiece 100 to safely administer and monitor sound exposure to the ear.

Figure 2:
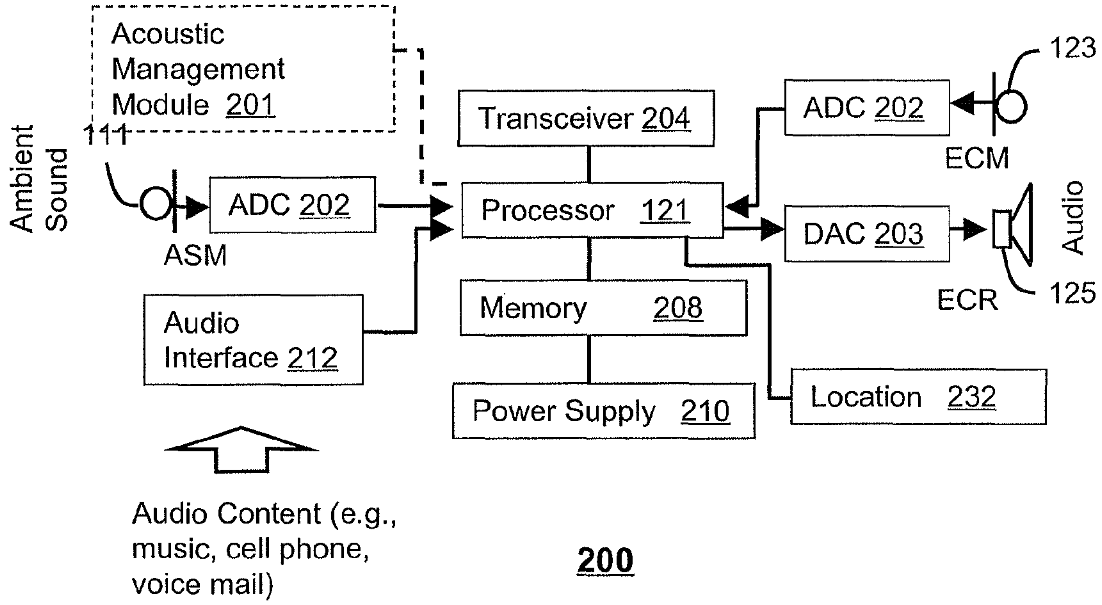
FIG. 2 is a block diagram of the earpiece in accordance with an exemplary embodiment.

Referring to FIG. 2, a block diagram 200 of the earpiece 100 in accordance with an exemplary embodiment is shown. As illustrated, the earpiece 100 can include the processor 121 operatively coupled to the ASM 111, ECR 125, and ECM 123 via one or more Analog to Digital Converters (ADC) 202 and Digital to Analog Converters (DAC) 203. The processor 121 can utilize computing technologies such as a microprocessor, Application Specific Integrated Chip (ASIC), and/or digital signal processor (DSP) with associated storage memory 208 such as Flash, ROM, RAM, SRAM, DRAM or other like technologies for controlling operations of the earpiece device 100. The processor 121 can also include a clock to record a time stamp.

As illustrated, the earpiece 100 can include an acoustic management module 201 to mix sounds captured at the ASM 111 and ECM 123 to produce a mixed signal. The processor 121 can then provide the mixed signal to one or more subsystems, such as a voice recognition system, a voice dictation system, a voice recorder, or any other voice related processor or communication device. The acoustic management module 201 can be a hardware component implemented by discrete or analog electronic components or a software component. In one arrangement, the functionality of the acoustic management module 201 can be provided by way of software, such as program code, assembly language, or machine language.

The earpiece 100 can measure ambient sounds in the environment received at the ASM 111. Ambient sounds correspond to sounds within the environment such as the sound of traffic noise, street noise, conversation babble, or any other acoustic sound. Ambient sounds can also correspond to industrial sounds present in an industrial setting, such as factory noise, lifting vehicles, automobiles, and robots to name a few.

The memory 208 can also store program instructions for execution on the processor 121 as well as captured audio processing data and filter coefficient data. The memory 208 can be off-chip and external to the processor 121, and include a data buffer to temporarily capture the ambient sound and the internal sound, and a storage memory to save from the data buffer the recent portion of the history in a compressed format responsive to a directive by the processor. The data buffer can be a circular buffer that temporarily stores audio sound at a current time point to a previous time point. It should also be noted that the data buffer can in one configuration reside on the processor 121 to provide high speed data access. The storage memory can be non-volatile memory such as SRAM to store captured or compressed audio data.

The earpiece 100 can include an audio interface 212 operatively coupled to the processor 121 and acoustic management module 201 to receive audio content, for example from a media player, cell phone, or any other communication device, and deliver the audio content to the processor 121. The processor 121 responsive to detecting spoken voice from the acoustic management module 201 can adjust the audio content delivered to the ear canal. For instance, the processor 121 (or acoustic management module 201) can lower a volume of the audio content responsive to detecting a spoken voice. The processor 121 by way of the ECM 123 can also actively monitor the sound exposure level inside the ear canal and adjust the audio to within a safe and subjectively optimized listening level range based on voice operating decisions made by the acoustic management module 201.

The earpiece 100 can further include a transceiver 204 that can support singly or in combination any number of wireless access technologies including without limitation Bluetooth™, Wireless Fidelity (WiFi), Worldwide Interoperability for Microwave Access (WiMAX), and/or other short or long range communication protocols. The transceiver 204 can also provide support for dynamic downloading over-the-air to the earpiece 100. It should be noted also that next generation access technologies can also be applied to the present disclosure.

The location receiver 232 can utilize common technology such as a common GPS (Global Positioning System) receiver that can intercept satellite signals and therefrom determine a location fix of the earpiece 100.

The power supply 210 can utilize common power management technologies such as replaceable batteries, supply regulation technologies, and charging system technologies for supplying energy to the components of the earpiece 100 and to facilitate portable applications. A motor (not shown) can be a single supply motor driver coupled to the power supply 210 to improve sensory input via haptic vibration. As an example, the processor 121 can direct the motor to vibrate responsive to an action, such as a detection of a warning sound or an incoming voice call.

The earpiece 100 can further represent a single operational device or a family of devices configured in a master-slave arrangement, for example, a mobile device and an earpiece. In the latter embodiment, the components of the earpiece 100 can be reused in different form factors for the master and slave devices.

Figure 3:
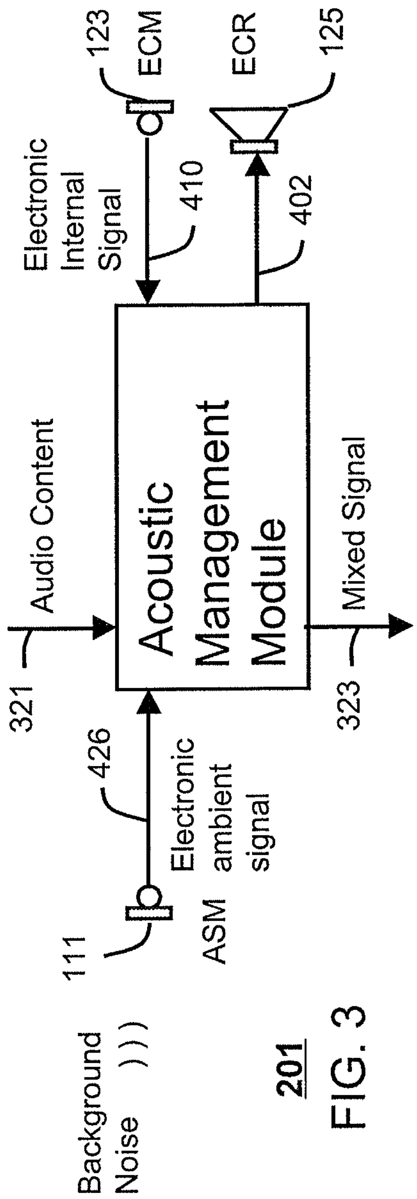
FIG. 3 is a block diagram for an acoustic management module in accordance with an exemplary embodiment.

FIG. 3 is a block diagram of the acoustic management module 201 in accordance with an exemplary embodiment. Briefly, the Acoustic management module 201 facilitates monitoring, recording and transmission of user-generated voice (speech) to a voice communication system. User-generated sound is detected with the ASM 111 that monitors a sound field near the entrance to a user's ear, and with the ECM 123 that monitors a sound field in the user's occluded ear canal. A new mixed signal 323 is created by filtering and mixing the ASM and ECM microphone signals. The filtering and mixing process is automatically controlled depending on the background noise level of the ambient sound field to enhance intelligibility of the new mixed signal 323. For instance, when the background noise level is high, the acoustic management module 201 automatically increases the level of the ECM 123 signal relative to the level of the ASM 111 to create the new mixed signal 323.

As illustrated, the ASM 111 is configured to capture ambient sound and produce an electronic ambient signal 426, the ECR 125 is configured to pass, process, or play acoustic audio content 402 (e.g., audio content 321, mixed signal 323) to the ear canal, and the ECM 123 is configured to capture internal sound in the ear canal and produce an electronic internal signal 410. The acoustic management module 201 is configured to measure a background noise signal from the electronic ambient signal 426 or the electronic internal signal 410, and mix the electronic ambient signal 426 with the electronic internal signal 410 in a ratio dependent on the background noise signal to produce the mixed signal 323. The acoustic management module 201 filters the electronic ambient signal 426 and the electronic internal 410 signal based on a characteristic of the background noise signal using filter coefficients stored in memory or filter coefficients generated algorithmically.

In practice, the acoustic management module 201 mixes sounds captured at the ASM 111 and the ECM 123 to produce the mixed signal 323 based on characteristics of the background noise in the environment such as a level of the background noise level, a spectral profile, or an envelope fluctuation. In noisy ambient environments, the voice captured at the ASM 111 includes the background noise from the environment, whereas, the internal voice created in the ear canal 131 captured by the ECM 123 has less noise artifacts, since the noise is blocked due to the occlusion of the earpiece 100 in the ear. It should be however noted that the background noise can enter the ear canal if the earpiece 100 is not completely sealed. Accordingly, the acoustic management module 201 monitors the electronic internal signal 410 for background noise (e.g., spectral comparison with the electronic ambient signal). It should also be noted that voice generated by a user of the earpiece 100 is captured at both the external ASM 111 and the internal ECM 123.

At low background noise levels, the acoustic management module 201 amplifies the electronic ambient signal 426 from the ASM 111 relative to the electronic internal signal 410 from the ECM 123 in producing the mixed signal 323. At medium background noise levels, the acoustic management module 201 attenuates low frequencies in the electronic ambient signal 426 and attenuates high frequencies in the electronic internal signal 410. At high background noise levels, the acoustic management module 201 amplifies the electronic internal signal 410 from the ECM 123 relative to the electronic ambient signal 426 from the ASM 111 in producing the mixed signal. As will be discussed ahead, the acoustic management module 201 can additionally apply frequency specific filters (see FIG. 10) based on the characteristics of the background noise.

Figure 4:
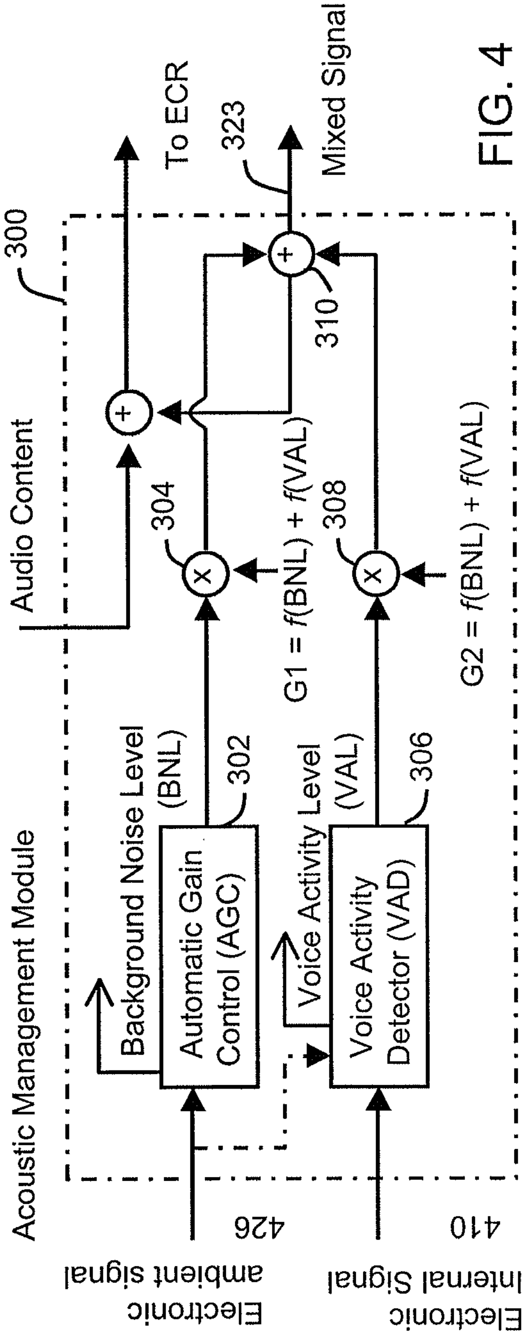
FIG. 4 is a schematic for the acoustic management module of FIG. 3 illustrating a mixing of an external microphone signal with an internal microphone signal as a function of a background noise level and voice activity level in accordance with an exemplary embodiment.

FIG. 4 is a schematic 300 of the acoustic management module 201 illustrating a mixing of the electronic ambient signal 426 with the electronic internal signal 410 as a function of a background noise level (BNL) and a voice activity level (VAL) in accordance with an exemplary embodiment. As illustrated, the acoustic management module 201 includes an Automatic Gain Control (AGC) 302 to measure background noise characteristics. The acoustic management module 201 also includes a Voice Activity Detector (VAD) 306. The VAD 306 can analyze either or both the electronic ambient signal 426 and the electronic internal signal 410 to estimate the VAL. As an example, the VAL can be a numeric range such as 0 to 10 indicating a degree of voicing. For instance, a voiced signal can be predominately periodic due to the periodic vibrations of the vocal cords. A highly voiced signal (e.g., vowel) can be associated with a high level, and a non-voiced signal (e.g., fricative, plosive, consonant) can be associated with a lower level.

The acoustic management module 201 includes a first gain (G1) 304 applied to the AGC processed electronic ambient signal 426. A second gain (G2) 308 is applied to the VAD processed electronic internal signal 410. The acoustic management module 201 applies the first gain (G1) 304 and the second gain (G2) 308 as a function of the background noise level and the voice activity level to produce the mixed signal 323, where $$G1 = f(\text{BNL}) + f(\text{VAL}) \text{ and } G2 = f(\text{BNL}) + f(\text{VAL})$$

As illustrated, the mixed signal is the sum 310 of the G1 scaled electronic ambient signal and the G2 scaled electronic internal signal. The mixed signal 323 can then be transmitted to a second communication device (e.g. second cell phone, voice recorder, etc.) to receive the enhanced voice signal. The acoustic management module 201 can also play the mixed signal 323 back to the ECR for loopback listening. The loopback allows the user to hear himself or herself when speaking, as though the earpiece 100 and associated occlusion effect were absent. The loopback can also be mixed with the audio content 321 based on the background noise level, the VAL, and audio content level. The acoustic management module 201 can also account for an acoustic attenuation level of the earpiece, and account for the audio content level reproduced by the ECR when measuring background noise characteristics.

Figure 5:
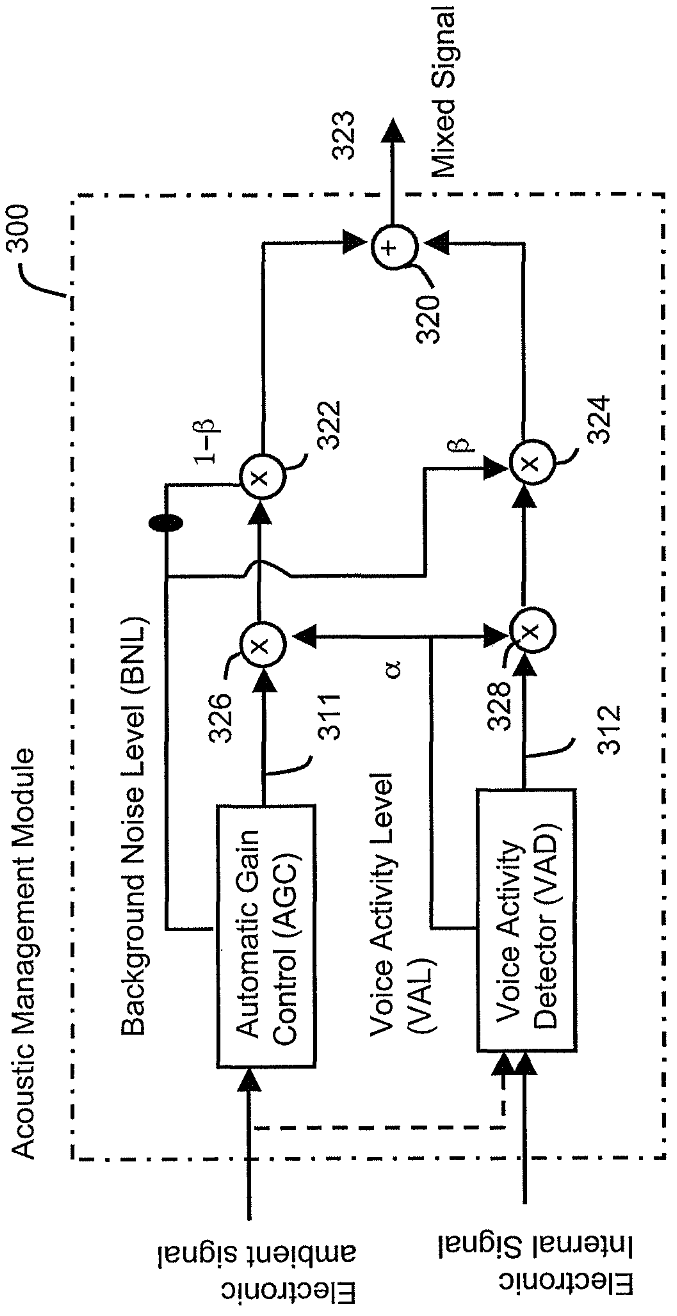
FIG. 5 is a more detailed schematic of the acoustic management module of FIG. 3 illustrating a mixing of an external microphone signal with an internal microphone signal based on a background noise level and voice activity level in accordance with an exemplary embodiment.

FIG. 5 is a more detailed schematic of the acoustic management module 201 illustrating a mixing of an external microphone signal with an internal microphone signal based on a background noise level and voice activity level in accordance with an exemplary embodiment. In particular, the gain blocks for G1 and G2 of FIG. 4 are a function of the BNL and the VAL and are shown in greater detail. As illustrated, the AGC produces a BNL that can be used to set a first gain 322 for the processed electronic ambient signal 311 and a second gain 324 for the processed electronic internal signal 312. For instance, when the BNL is low (<70 dBA), gain 322 is set higher relative to gain 324 so as to amplify the electronic ambient signal 311 in greater proportion than the electronic internal signal 312. When the BNL is high (>85 dBA), gain 322 is set lower relative to gain 324 so as to attenuate the electronic ambient signal 311 in greater proportion than the electronic internal signal 312. The mixing can be performed in accordance with the relation:

$$\text{Mixed signal} = (1-\beta)\ \text{electronic ambient signal} + (\beta)*\text{electronic internal signal}$$

Where $(1-\beta)$ is an external gain, $(\beta)$ is an internal gain, and the mixing is performed with $0<\beta<1$.

As illustrated, the VAD produces a VAL that can be used to set a third gain 326 for the processed electronic ambient signal 311 and a fourth gain 328 for the processed electronic internal signal 312. For instance, when the VAL is low (e.g., 0-3), gain 326 and gain 328 are set low so as to attenuate the electronic ambient signal 311 and the electronic internal signal 312 when spoken voice is not detected. When the VAL is high (e.g., 7-10), gain 326 and gain 328 are set high so as to amplify the electronic ambient signal 311 and the electronic internal signal 312 when spoken voice is detected.

The gain scaled processed electronic ambient signal 311 and the gain scaled processed electronic internal signal 312 are then summed at adder 320 to produce the mixed signal 323. The mixed signal 323, as indicated previously, can be transmitted to another communication device, or as loopback to allow the user to hear his or her self.

Figure 6:
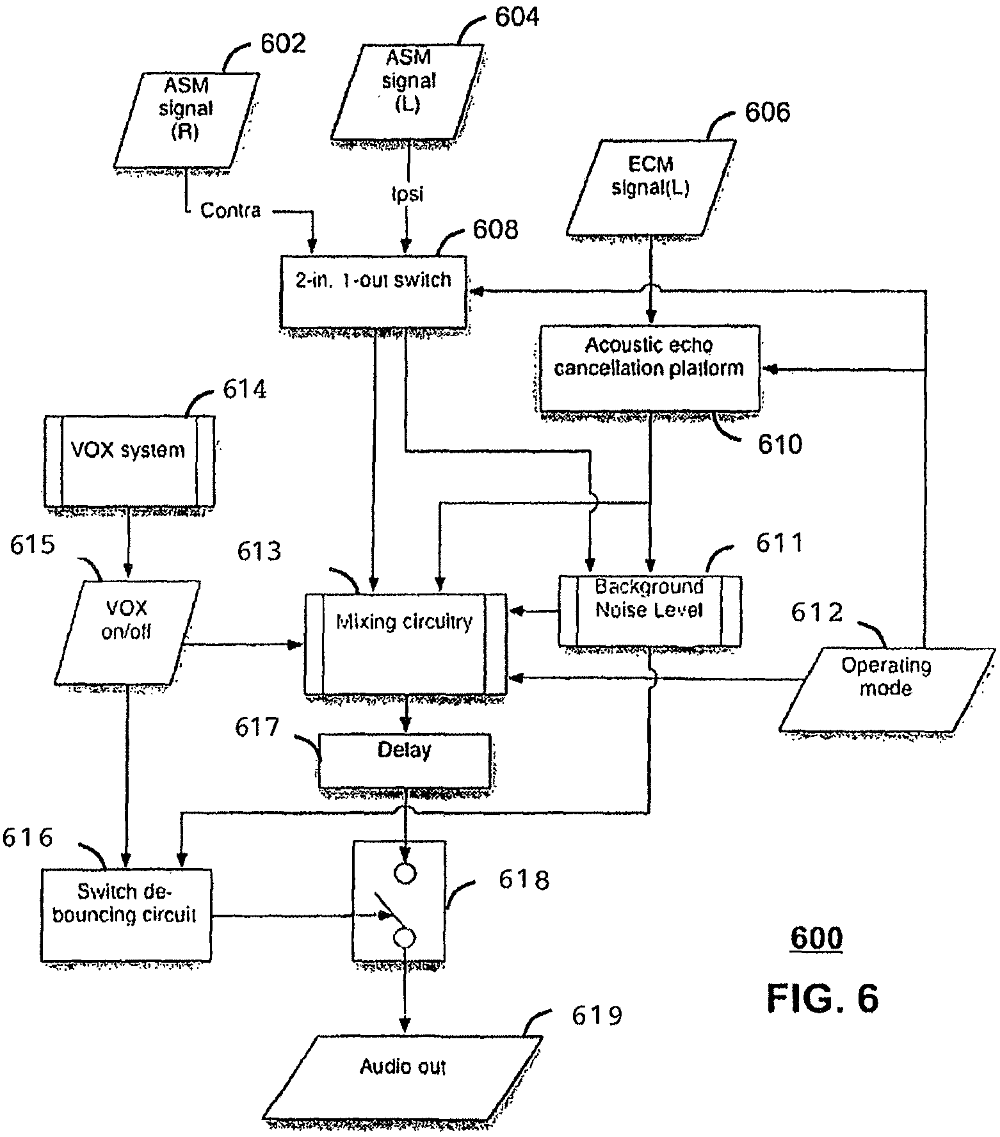
FIG. 6 is a block diagram of a method for an audio mixing system to mix an external microphone signal with an internal microphone signal based on a background noise level and voice activity level in accordance with an exemplary embodiment.

FIG. 6 is a block diagram 600 of a method for an audio mixing system to mix an external microphone signal with an internal microphone signal based on a background noise level and voice activity level in accordance with an exemplary embodiment.

As illustrated the mixing circuitry 613 (shown in center) receives an estimate of the background noise level 611 for mixing either or both the right earpiece ASM signal 602 and the left earpiece ASM signal 604 with the left earpiece ECM signal 606. (The right earpiece ECM signal can be used similarly.) An operating mode 612 selects a switching 608 (e.g., 2-in, 1-out) between the left earpiece ASM signal 604 and the right earpiece ASM signal 602. As indicated earlier, the ASM signals and ECM signals can be first amplified with a gain system and then filtered with a filter system (the filtering may be accomplished using either analog or digital electronics). The audio input signals 602, 604, 606 are therefore taken after this gain and filtering process.

The Acoustic Echo Cancellation (AEC) system 610 can be activated with the operating mode selection system 612 when the mixed signal audio output 619 is reproduced with the ECR 125 in the same ear as the ECM 123 signal used to create the mixed signal audio output 619. The acoustic echo cancellation platform 610 can also suppress an echo of a spoken voice generated by the wearer of the earpiece 100. This ensures against acoustic feedback ("howlback").

The Voice Activated System (VOX) 614 in conjunction with a de-bouncing circuit 616 activates the electronic switch 618 to control the mixed signal output 619 from the mixing circuitry 613; the mixed signal is a combination of the left ASM signal 604 or right ASM signal 602, with the left ECM 606 signal. Though not shown, the same arrangement applies for the other earphone device for the right ear, if present. In a contra-lateral operating mode, as selected by operating mode selection system 612, the ASM and ECM signal are taken from opposite earphone devices, and the mix of these signals is reproduced with the ECR in the earphone that is contra-lateral to the ECM signal, and the same as the ASM signal.

For instance, in the contra-lateral operating mode, the ASM signal from the Right earphone device is mixed with the ECM signal from the left earphone device, and the audio signal corresponding to a mix of these two signals is reproduced with the Ear Canal Receiver (ECR) in the Right earphone device. The mixed signal audio output 619 therefore contains a mix of the ASM and ECM signals when the user's voice is detected by the VOX. This mixed signal audio output can be used in loopback as a user Self-Monitor System to allow the user to hear their own voice as reproduced with the ECR 125, or it may be transmitted to another voice system, such as a mobile phone, walkie-talkie radio etc. The VOX system 614 that activates the switch 618 may be one a number of VOX embodiments.

Figure 8:
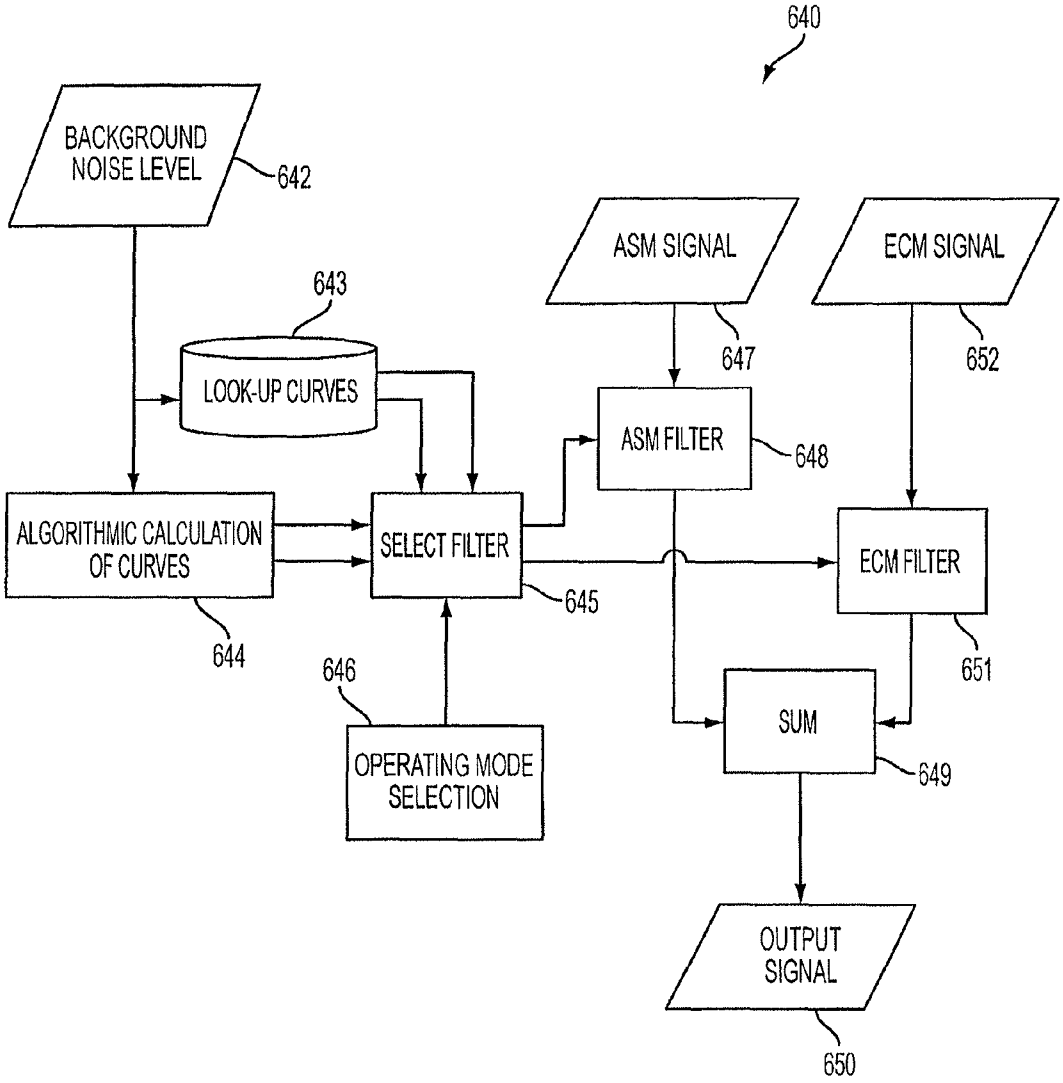
FIG. 8 is a block diagram for mixing an external microphone signal with an internal microphone signal based on a background noise level in accordance with an exemplary embodiment.
Figure 9:
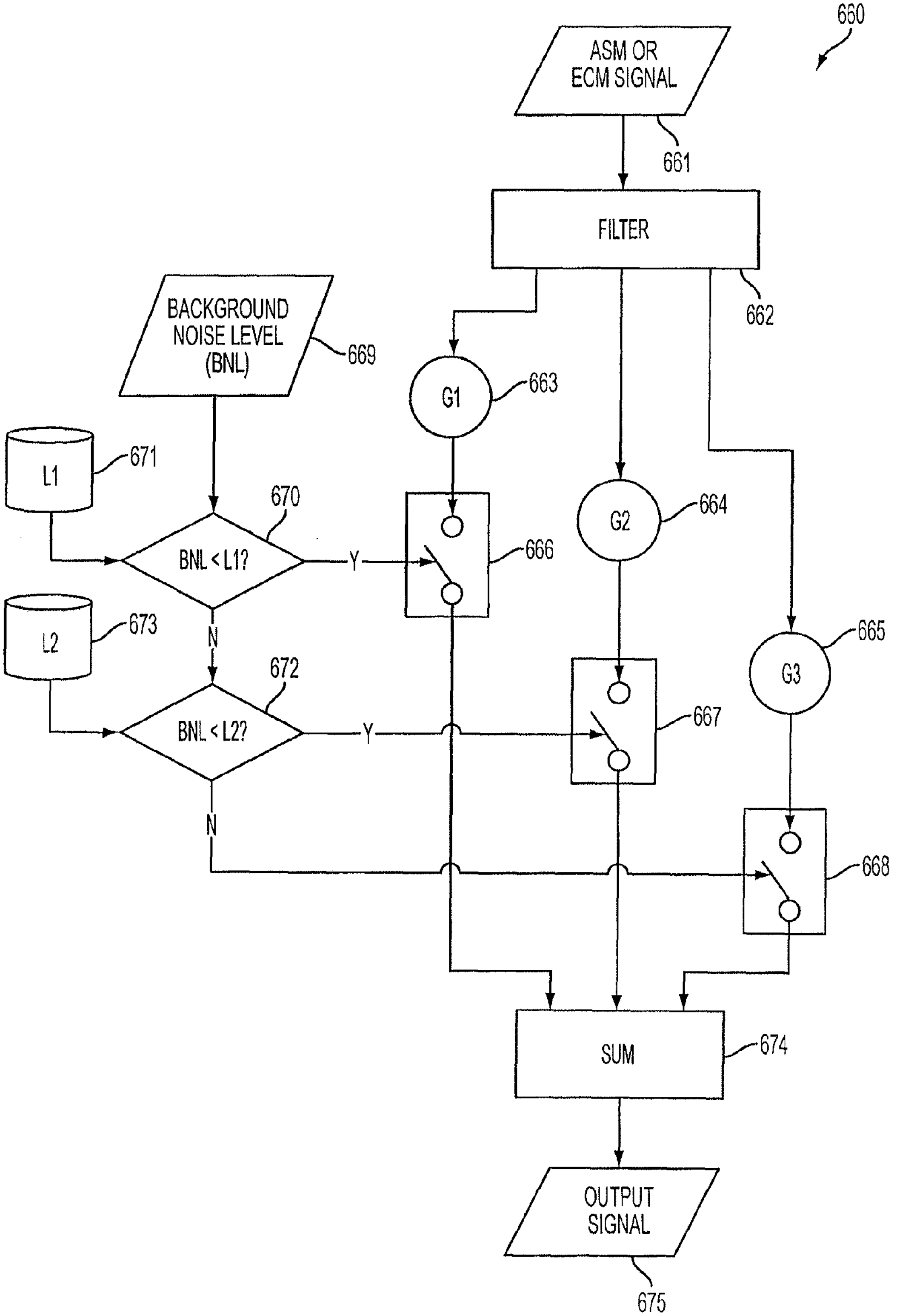
FIG. 9 is a block diagram for an analog circuit for mixing an external microphone signal with an internal microphone signal based on a background noise level in accordance with an exemplary embodiment.

In a particular operating mode, specified by unit 612, the conditioned ASM signal is mixed with the conditioned ECM signal with a ratio dependant on the BNL using audio signal mixing circuitry and the method described in either FIG. 8 or FIG. 9. As the BNL increases, then the ASM signal is mixed with the ECM signal with a decreasing level. When the BNL is above a particular value, then a minimal level of the ASM signal is mixed with the ECM signal. When the VOX switch 618 is active, the mixed ASM and ECM signals are then sent to mixed signal output 619. The switch de-bouncing circuit 616 ensures against the VOX 614 rapidly closing on and off (sometimes called chatter). This can be achieved with a timing circuit using digital or analog electronics. For instance, with a digital system, once the VOX has been activated, a time starts to ensure that the switch 618 is not closed again within a given time period, e.g. 100 ms. The delay unit 617 can improve the sound quality of the mixed signal audio output 619 by compensating for any latency in voice detection by the VOX system 614. In some exemplary embodiments, the switch debouncing circuit 616 can be dependent by the BNL. For instance, when the BNL is high (e.g. above 85 dBA), the de-bouncing circuit can close the switch 618 sooner after the VOX output 615 determines that no user speech (e.g. spoken voice) is present.

Figure 7:
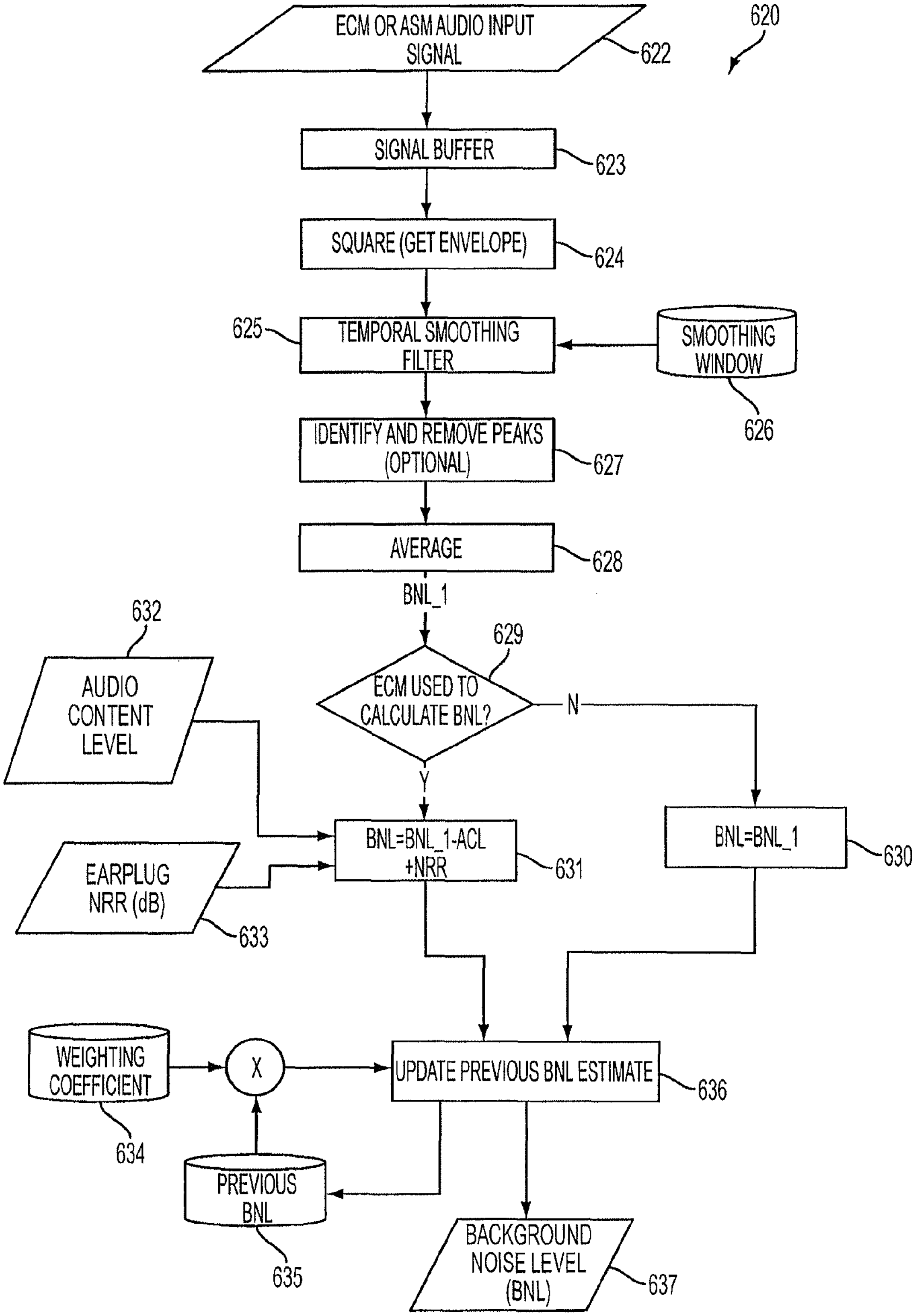
FIG. 7 is a block diagram of a method for calculating background noise levels in accordance with an exemplary embodiment.

FIG. 7 is a block diagram of a method 620 for calculating background noise levels in accordance with an exemplary embodiment. Briefly, the background noise levels can be calculated according to different contexts, for instance, if the user is talking while audio content is playing, if the user is talking while audio content is not playing, if the user is not talking but audio content is playing, and if the user is not talking and no audio content is playing. For instance, the system takes as its inputs either the ECM or ASM signal, depending on the particular system configuration. If the ECM signal is used, then the measured BNL accounts for an acoustic attenuation of the earpiece and a level of reproduced audio content.

As illustrated, modules 622-628 provide exemplary steps for calculating a base reference background noise level. The ECM or ASM audio input signal 622 can be buffered 623 in real-time to estimate signal parameters. An envelope detector 624 can estimate a temporal envelope of the ASM or ECM signal. A smoothing filter 625 can minimize abruptions in the temporal envelope. (A smoothing window 626 can be stored in memory). An optional peak detector 627 can remove outlier peaks to further smooth the envelope. An averaging system 628 can then estimate the average background noise level (BNL_1) from the smoothed envelope.

If at step 629, it is determined that the signal from the ECM was used to calculate the BNL_1, an audio content level 632 (ACL) and noise reduction rating 633 (NRR) can be subtracted from the BNL_1 estimate to produce the updated BNL 631. This is done to account for the audio content level reproduced by the ECR 125 that delivers acoustic audio content to the earpiece 100, and to account for an acoustic attenuation level (i.e. Noise Reduction Rating 633) of the earpiece. For example, if the user is listening to music, the acoustic management module 201 takes into account the audio content level delivered to the user when measuring the BNL. If the ECM is not used to calculate the BNL at step 629, the previous real-time frame estimate of the BNL 630 is used.

At step 636, the acoustic management module 201 updates the BNL based on the current measured BNL and previous BNL measurements 635. For instance, the updated BNL 637 can be a weighted estimate 634 of previous BNL estimates according to BNL=2*previous BNL+(1−w)*current BNL, where 0<W<1. The BNL can be a slow time weighted average of the level of the ASM and/or ECM signals, and may be weighted using a frequency-weighting system, e.g. to give an A-weighted SPL level.

FIG. 8 is a block diagram 640 for mixing an external microphone signal with an internal microphone signal based on a background noise level to produce a mixed output signal in accordance with an exemplary embodiment. The block diagram can be implemented by the acoustic management module 201 or the processor 121. In particular, FIG. 8 primarily illustrates the selection of microphone filters based on the background noise level. The microphone filters are used to condition the external and internal microphone signals before mixing.

As shown, the filter selection module 645 can select one or more filters to apply to the microphone signals before mixing. For instance, the filter selection module 645 can apply an ASM filter 648 to the ASM signal 647 and an ECM filter 651 to the ECM signal 652 based on the background noise level 642. The ASM and ECM filters can be retrieved from memory based on the characteristics of the background noise. An operating mode 646 can determine whether the ASM and ECM filters are look-up curves 643 from memory or filters whose coefficients are determined in real-time based on the background noise levels.

Prior to mixing with summing unit 649 to produce output signal 650, the ASM signal 647 is filtered with ASM filter 648, and the ECM signal 652 is filtered with ECM filter 651.

The filtering can be accomplished by a time-domain transversal filter (FIR-type filter), an IIR-type filter, or with frequency-domain multiplication. The filter can be adaptive (i.e. time variant), and the filter coefficients can be updated on a frame-by-frame basis depending on the BNL. The filter coefficients for a particular BNL can be loaded from computer memory using pre-defined filter curves 643, or can be calculated using a predefined algorithm 644, or using a combination of both (e.g. using an interpolation algorithm to create a filter curve for both the ASM filter 648 and ECM filter 651 from predefined filters).

Figure 10:
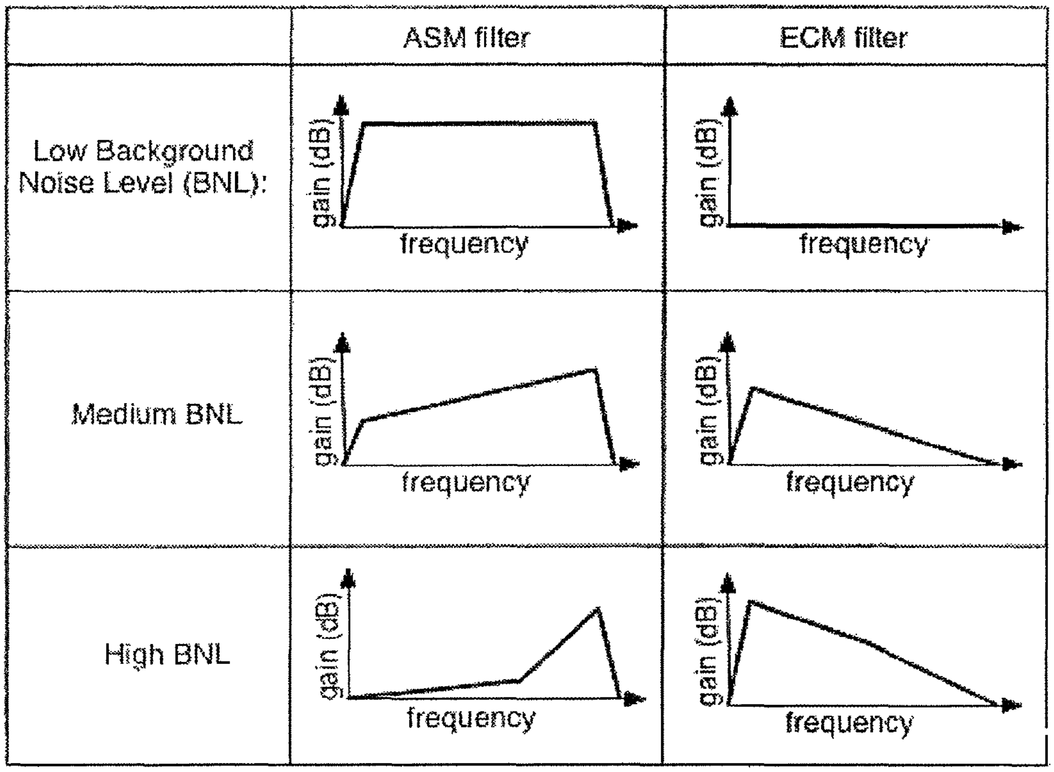
FIG. 10 is a table illustrating exemplary filters suitable for use with an Ambient Sound Microphone (ASM) and Ear Canal Microphone (ECM) based on measured background noise levels (BNL) in accordance with an exemplary embodiment.

Examples of filter response curves for three different BNL are shown in FIG. 10, which is a table illustrating exemplary filters suitable for use with an Ambient Sound Microphone (ASM) and Ear Canal Microphone (ECM) based on measured background noise levels (BNL).

The basic trend for the ASM and ECM filter response at different BNLs is that at low BNLs (e.g. <60 dBA), the ASM signal is primarily used for voice communication. At medium BNL; ASM and ECM are mixed in a ratio depending on the BNL, though the ASM filter can attenuate low frequencies of the ASM signal, and attenuate high frequencies of the ECM signal. At high BNL (e.g. >85 dB), the ASM filter attenuates most all the low frequencies of the ASM signal, and the ECM filter attenuates most all the high frequencies of the ECM signal. In another embodiment of the Acoustic Management System, the ASM and ECM filters may be adjusted by the spectral profile of the background noise measurement. For instance, if there is a large Low Frequency noise in the ambient sound field of the user, then the ASM filter can reduce the low-frequencies of the ASM signal accordingly, and boost the low-frequencies of the ECM signal using the ECM filter.

FIG. 9 is a block diagram for an analog circuit for mixing an external microphone signal with an internal microphone signal based on a background noise level in accordance with an exemplary embodiment.

In particular, FIG. 9 shows a method 660 for the filtering of the ECM and ASM signals using analog electronic circuitry prior to mixing. The analog circuit can process both the ECM and ASM signals in parallel; that is, the analog components apply to both the ECM and ASM signals. In one exemplary embodiment, the input audio signal 661 (e.g., ECM signal, ASM signal) is first filtered with a fixed filter 662. The filter response of the fixed filter 662 approximates a low-pass shelf filter when the input signal 661 is an ECM signal, and approximates a high-pass filter when the input signal 661 is an ASM signal. In an alternate exemplary embodiment, the filter 662 is a unity-pass filter (i.e. no spectral attenuation) and the gain units G1, G2 etc instead represent different analog filters. As illustrated, the gains are fixed, though they may be adapted in other embodiments. Depending on the BNL 669, the filtered signal is then subjected to one of three gains; G1 663, G2 664, or G3 665. (The analog circuit can include more or less than the number of gains shown.)

For low BNLs (e.g. when BNL<L1 670, where L1 is a predetermined level threshold 671), a G1 is determined for both the ECM signal and the ASM signal. The gain G1 for the ECM signal is approximately zero; i.e. no ECM signal would be present in the output signal 675. For the ASM input signal, G1 would be approximately unity for low BNL.

For medium BNLs (e.g. when BNL<L2 672, where L2 is a predetermined level threshold 673), a G2 is determined for both the ECM signal and the ASM signal. The gain G2 for the ECM signal and the ASM signal is approximately the same. In another embodiment, the gain G2 can be frequency dependent so as to emphasize low frequency content in the ECM and emphasize high frequency content in the ASM signal in the mix. For high BNL; G3 665 is high for the ECM signal, and low for the ASM signal. The switches 666, 667, and 668 ensure that only one gain channel is applied to the ECM signal and ASM signal. The gain scaled ASM signal and ECM signal are then summed at junction 674 to produce the mixed output signal 675.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions of the relevant exemplary embodiments. Thus, the description of the invention is merely exemplary in nature and, thus, variations that do not depart from the gist of the invention are intended to be within the scope of the exemplary embodiments of the present invention. Such variations are not to be regarded as a departure from the spirit and scope of the present invention.

What is claimed is:

1. A method for acoustic management control suitable for use in an earpiece, the method comprising the steps of:
- capturing an ambient acoustic signal from at least one Ambient Sound Microphone (ASM) to produce an electronic ambient signal;
- determining a background noise signal from the electronic ambient signal;
- estimating a voice activity level from the electronic ambient signal; and
- adjusting a characteristic of the electronic ambient signal as a function of the voice activity level and the background noise signal to produce an adjusted signal.

2. The method of claim 1, where the step of adjusting includes adjusting an external gain of the electronic ambient signal based on the background noise signal.

3. The method of claim 1, where the step of adjusting includes filtering the electronic ambient signal based on a characteristic of the background noise signal,
- where the characteristic of the background noise signal is a level of a background noise level, a spectral profile, or an envelope fluctuation.

4. The method of claim 3, where filter coefficients for a particular background noise level or a particular spectral profile are loaded from a memory containing pre-defined filter curves.

5. The method of claim 3, where filter coefficients are algorithmically determined for a particular background noise level or a particular spectral profile.

6. The method of claim 1, further comprising
- scaling the electronic ambient signal in accordance with the voice activity level.

7. The method of claim 6, wherein the adjusting is performed by applying a gain to the electronic ambient signal, the gain being a function of a background noise level (BNL) and the voice activity level (VAL).

8. The method of claim 1, where the step of measuring the background noise signal includes at least one of:
- accounting for an acoustic attenuation level of the earpiece, or
- accounting for an audio content level reproduced by an Ear Canal Receiver (ECR) that delivers acoustic audio content to the earpiece.

9. The method of claim 1, further comprising delivering the adjusted signal to the earpiece via an Ear Canal Receiver (ECR).

10. The method of claim 1, further comprising recording the adjusted signal.

11. The method of claim 1, further comprising delivering the adjusted signal to a remote device coupled to the earpiece.

12. The method of claim 11, wherein the remote device includes at least one of a further earpiece, a cell phone, a media player, a portable computing device, a recording device or a personal digital assistant.

13. The method of claim 1, wherein the at least one ASM comprises a plurality of ASMs and wherein the at least one ASM of the plurality of ASMs is located in at least one of internal to the earpiece or external to the earpiece on a remote device.

14. A method for acoustic management control suitable for use in an earpiece, the method comprising the steps of:

capturing an ambient acoustic signal from at least one Ambient Sound Microphone (ASM) to produce an electronic ambient signal;

detecting a spoken voice signal generated by a wearer of the earpiece from the electronic ambient signal;

determining a background noise level from the electronic ambient signal when the spoken voice signal is not detected;

generating a voice activity level of the spoken voice signal; and adjusting a characteristic of the electronic ambient signal as a function of the voice activity level and the background noise level to produce an adjusted signal.

15. The method of claim 14, comprising delivering audio content to the ear canal by way of an Ear Canal Receiver (ECR); and adjusting the characteristic of the electronic ambient signal based on a level of the audio content, the background noise level, and an acoustic attenuation level of the earpiece.

16. The method of claim 15, wherein the audio content is at least one among a phone call, a voice message, a music signal, and the spoken voice signal.

17. The method of claim 14, comprising suppressing in the adjusted signal an echo of the spoken voice signal generated by the wearer of the earpiece, and producing a modified electronic ambient signal containing primarily the spoken voice signal.

18. The method of claim 17, wherein the suppressing is performed by way of a normalized least mean squares algorithm.

19. The method of claim 14, further comprising delivering the adjusted signal to the earpiece via an Ear Canal Receiver (ECR).

20. The method of claim 14, further comprising recording the adjusted signal.

21. The method of claim 14, further comprising delivering the adjusted signal to a remote device coupled to the earpiece.

22. The method of claim 21, wherein the remote device includes at least one of a further earpiece, a cell phone, a media player, a portable computing device, a recording device or a personal digital assistant.

23. The method of claim 14, wherein the at least one ASM comprises a plurality of ASMs and wherein the at least one ASM of the plurality of ASM is located in at least one of internal to the earpiece or external to the earpiece on a remote device.

24. An earpiece system for acoustic management control, comprising:

at least one Ambient Sound Microphone (ASM) configured to capture ambient sound and produce an electronic ambient signal;

an Ear Canal Receiver (ECR) to deliver audio content to an ear canal to produce an acoustic audio content; and a processor operatively coupled to the at least one ASM and the ECR where the processor is configured to detect a spoken voice signal generated by a wearer of the earpiece from the electronic ambient signal;

determine a background noise signal from the electronic ambient signal when a spoken voice signal is not detected;

generate a voice activity level of the spoken voice signal; and adjust a characteristic of the electronic ambient signal dependent on the voice activity level and the background noise signal to produce an adjusted signal.

25. The earpiece system of claim 24, wherein the processor filters the electronic ambient signal based on a characteristic of the background noise signal using filter coefficients stored in a memory or generated algorithmically.

26. The earpiece system of claim 24, further comprising a transceiver operatively coupled to the processor to transmit the adjusted signal to a remote device, where the processor also plays the adjusted signal back to the ECR for loopback listening.

27. The earpiece system of claim 26, wherein the remote device includes at least one of a further earpiece, a cell phone, a media player, a portable computing device, a recording device, a communication device or a personal digital assistant.

28. The earpiece system of claim 24, further comprising an echo suppressor operatively coupled to the processor to suppress an echo of a spoken voice generated by a wearer of an earpiece of the earpiece system when speaking.

29. The earpiece system of claim 28, further comprising a voice activity detector operatively coupled to the echo suppressor to detect the spoken voice generated by the wearer in the presence of the background noise signal.

30. The earpiece system of claim 29, where the processor generates the voice activity level for the spoken voice and applies a gain to the electronic ambient signal as a function of a background noise level and the voice activity level.

31. The earpiece system of claim 24, wherein the earpiece system includes an earpiece and a remote device coupled to the earpiece, the at least one ASM being located at least one of internal to the earpiece or external to the earpiece on the remote device.

* * * * *